(12) United States Patent
Inada

(10) Patent No.: US 8,039,780 B2
(45) Date of Patent: Oct. 18, 2011

(54) PHOTODIODE ARRAY AND IMAGE PICKUP DEVICE USING THE SAME

(75) Inventor: Hiroshi Inada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 91 days.

(21) Appl. No.: 12/420,668

(22) Filed: Apr. 8, 2009

(65) Prior Publication Data
US 2010/0258707 A1 Oct. 14, 2010

(51) Int. Cl.
H01L 27/00 (2006.01)
H01L 31/00 (2006.01)
H01L 47/00 (2006.01)
H01L 29/06 (2006.01)
H01L 29/04 (2006.01)

(52) U.S. Cl. .......... 250/208.1; 250/214.1; 257/4; 257/5; 257/59

(58) Field of Classification Search ............... 250/208.1, 250/214 R, 214 A, 214 LA, 214.1; 257/127, 257/186, 292, 434, 438, 437, 3, 4, 5, 7, 8, 257/59, 60, 167, 177, 178; 348/203, 303, 348/304, 316, 318, 319
See application file for complete search history.

(56) References Cited

U.S. PATENT DOCUMENTS

| 6,114,737 A * | 9/2000 | Tonai ............................. 257/434 |
| 2005/0040146 A1* | 2/2005 | Takami ..................... 219/121.63 |
| 2006/0017817 A1* | 1/2006 | Okubo ..................... 348/208.99 |

FOREIGN PATENT DOCUMENTS

| JP | 06-165049 | 6/1994 |
| JP | 11-275466 | 10/1999 |
| JP | 2007-201432 | 8/2007 |

OTHER PUBLICATIONS

Cohen et al., "Near-IR imaging cameras operate at room temperature", Laser Focus World, pp. 109-113 (1993).

* cited by examiner

Primary Examiner — Georgia Y Epps
Assistant Examiner — Don Williams
(74) Attorney, Agent, or Firm — Venable LLP; Michael A. Sartori; Leigh D. Thelen

(57) ABSTRACT

A photodiode array includes a plurality of photodiodes arranged in a single semiconductor laminate including a first conductivity-type semiconductor layer and an absorption layer overlying the first conductivity-type semiconductor layer. The photodiode array also includes a functional portion among the photodiodes in a predetermined proportion. The functional portion acts as a monitor light receiving portion and/or a charge sweep portion. Each of the photodiodes and functional portion has a second conductivity-type region reaching the absorption layer from the surface of the semiconductor laminate and an electrode in ohmic contact with the second conductivity-type region.

16 Claims, 8 Drawing Sheets

5000

5000

(Automatic gain control)

PHOTODIODE ARRAY AND IMAGE PICKUP DEVICE USING THE SAME

BACKGROUND OF THE INVENTION

1. Field of the Invention

The present invention relates to photodiode arrays and image pickup devices. More specifically, the invention relates to a photodiode array and an image pickup device that have a light-receiving sensitivity in a wavelength region extending to the near infrared region at the long-wavelength side.

2. Description of the Related Art

Group III-V compound semiconductors have received attention as compound semiconductors having band gap energy suitable for wavelengths in the near infrared region or in a region of still longer wavelengths, and have been being researched and developed. For example, Marshall J. Cohen and Gregory H. Olsen disclose a night-vision camera receiving natural light from space ("Near-IR imaging cameras operate at room temperature", LASER FOCUS WORLD, June 1993, pp. 109-113). The night-vision camera includes a photodiode array including photodiodes arranged on an InP substrate. The photodiode includes an InGaAs absorption layer lattice-matching with InP. The use of such a photodiode array allows images to be picked up with natural light, but not artificial lighting, even during the night or in rain.

If bright light enters the field of view of the night-vision camera when it forms an image with a relatively low-intensity incident light, however, halation occurs and images are not formed until carriers are removed from photodiode. When, for example, the brightness varies largely during image pickup of a motion picture, the night-vision camera easily comes into a state where it cannot form images. It is undesirable that a state where images cannot be formed arises in an image pickup device (sensor) for the near infrared region, from which various applications are expected. This problem should be overcome.

In addition, it is difficult that the night-vision camera forms a smooth motion picture. The silicon IC (Integrated Circuit) in which the driving circuit of the night-vision camera is to be formed limits the capacity to be provided and accordingly it takes a long time to sweep out the accumulated carriers. Hence, the frequency of the output of image forming signals is limited, and smooth motion pictures cannot be formed.

SUMMARY OF THE INVENTION

Accordingly, an object of the invention is to provide a photodiode array and an image pickup device that do not come to a state where images cannot be formed even if bright light enters or the brightness of the object is momentarily increased, and/or that can sweep out accumulated carriers in a short time to produce smooth motion pictures.

According to an aspect of the invention, a photodiode array is provided which includes a plurality of photodiodes arranged in a single semiconductor laminate including a first conductivity-type semiconductor layer and an absorption layer on the first conductivity-type semiconductor layer. The photodiode array has the following technical features: (1) functional portions are provided among the photodiodes in a predetermined proportion; (2) each of the photodiodes and functional portions has a second conductivity-type region reaching the absorption layer from the surface of the semiconductor laminate and an electrode in ohmic contact with the second conductivity-type region; and (3) the functional portions include a monitor light-receiving portion and a charge sweep portion.

In this instance, the "absorption layer on the first conductivity-type semiconductor layer" means that the absorption layer is disposed on the surface side when viewed from the first conductivity-type semiconductor layer. The absorption layer may be or may not be in contact with the first conductivity-type semiconductor layer. The semiconductor laminate may include a semiconductor substrate, or the first conductivity-type semiconductor layer may act as the semiconductor substrate. The absorption layer may be of a first conductivity type or of an intrinsic type, and its conductivity type does not matter.

At least one of the functional portions acts as a monitor light-receiving portion. In this structure, the monitor light-receiving portion can receive the incident light and monitor the intensity of the light with the pn junction having a depletion layer and output it as a current, as well as the photodiodes. Thus, an external circuit (driving circuit) outputs a signal for controlling the gain or on-off state of the photodiodes, based on the output signal of the light intensity. Consequently, the resulting photodiode array for image pickup devices does not come to a state where images cannot be formed which results from the continuation of a state in which carriers are saturated by entry of highly bright light.

At least one of the functional portions acts as a charge sweep portion. In this structure, a reverse bias voltage is applied to the charge sweep portion in synchronization with the timing of image formation with a specific relationship to spread the depletion layer and thus to remove the carriers accumulated in the pn junctions of the photodiodes. Thus, the time required for removing the carriers can be reduced. Consequently, images can be renewed in a short time to increase the frequency of image formation, and thus smooth motion pictures can be produced.

According to another aspect of the invention, a photodiode array is provided which includes a plurality of photodiodes arranged in a single semiconductor laminate including a first conductivity-type semiconductor layer and an absorption layer on the first conductivity-type semiconductor layer. The photodiode array has the following technical features: (1) a functional portion is provided among the photodiodes in a predetermined proportion; (2) each of the photodiodes and functional portion has a second conductivity-type region reaching the absorption layer from the top surface of the semiconductor laminate and an electrode in ohmic contact with the second conductivity-type region; and (3) the functional portion is a monitor light-receiving portion.

In this instance, the "absorption layer on the first conductivity-type semiconductor layer" means that the absorption layer is disposed on the surface side when viewed from the first conductivity-type semiconductor layer. The absorption layer may be or may not be in contact with the first conductivity-type semiconductor layer. The semiconductor laminate may include a semiconductor substrate, or the first conductivity-type semiconductor layer may act as the semiconductor substrate. The absorption layer may be of a first conductivity type or of an intrinsic type, and its conductivity type does not matter.

Consequently, the monitor light-receiving portion can receive the incident light and monitor the intensity of the light with the pn junction having a depletion layer and output it as a current, as well as the photodiodes. Thus, an external circuit (driving circuit) outputs a signal for controlling the gain or on-off state of the photodiodes, according to the output signal of the light intensity. Consequently, the resulting photodiode array for image pickup devices does not come to a state where images cannot be formed which results from the continuation of a state in which carriers are saturated by entry of highly bright light.

The second conductivity-type region of the monitor light-receiving portion may have a smaller area than the second conductivity-type region of the photodiode when viewed from above. Thus, the monitor light-receiving portion can be saturated earlier than the photodiode, and accordingly signals can be processed at a high speed by a wired logic circuit without microcomputer control. If microcomputer control is performed, the control is easy.

According to another aspect of the invention, a photodiode array is provided which includes a plurality of photodiodes arranged in a single semiconductor laminate including a first conductivity-type semiconductor layer and an absorption layer on the first conductivity-type semiconductor layer. The photodiode array has the following technical features: (1) a functional portion is provided among the photodiodes in a predetermined proportion; (2) each of photodiodes and functional portion has a second conductivity-type region reaching the absorption layer from the top surface of the semiconductor laminate and an electrode in ohmic contact with the second conductivity-type region; and (3) the functional portion is a charge sweep portion.

In this instance, the "absorption layer on the first conductivity-type semiconductor layer" means that the absorption layer is disposed on the surface side when viewed from the first conductivity-type semiconductor layer. The absorption layer may be or may not be in contact with the first conductivity-type semiconductor layer. The semiconductor laminate may include a semiconductor substrate, or the first conductivity-type semiconductor layer may act as the semiconductor substrate. The absorption layer may be of a first conductivity type or of an intrinsic type, and its conductivity type does not matter.

In this structure, a reverse bias voltage is applied to the charge sweep portion in synchronization with the timing of image formation with a specific relationship to spread the depletion layer and thus to remove the carriers accumulated in the pn junctions of the photodiodes. Thus, the time required for removing the carriers can be reduced. Consequently, images can be renewed in a short time to increase the frequency of image formation, and thus smooth motion pictures can be produced.

The charge sweep portion may be arranged in a proportion of one to every four photodiodes, and is disposed at the center of an area defined by the four photodiodes when viewed from above. Thus charges can be rapidly removed from the four photodiodes in the simple arrangement in which the four photodiodes are disposed with the same distance from the charge sweep portion so that the depletion layer comes into contact with the photodiodes to remove the charges. Consequently, a step of image formation can immediately be renewed to the following image formation step, and thus the frequency of image formation can be increased.

Each layer of the semiconductor laminate may be made of a Group III-V compound semiconductor and the second conductivity-type region is doped with Zn. Thus, well-known Zn is selectively diffused into the semiconductor laminate to facilitate the formation of pn junctions in the absorption layer.

The photodiodes may be pin-photodiodes. Thus, the depletion layers extending from the pn junctions or pi junctions of the photodiodes and the monitor light-receiving portion can be widely spread by applying a low reverse bias voltage or no voltage to increase the light-receiving sensitivity of the photodiodes. In addition, the occurrence of the state where images cannot be formed, which results from the entry of highly bright light, can be prevented by gain control or on-off control with the monitor light-receiving portion and an external driving circuit.

According to another aspect of the invention, an image pickup device is provided which includes the above-described photodiode array having the functional portions including the monitor light-receiving portion and the charge sweep portion, and a driving circuit driving the photodiode array. In the image pickup device, the driving circuit transmits a control signal to the photodiodes of the photodiode array based on a signal of light reception level from the monitor light-receiving portion to control the gain or on-off state of the photodiodes. Also, the driving circuit applies a pulsed reverse bias voltage to the charge sweep portion in synchronization with the driving timing of the photodiodes with a specific relationship so that charges accumulated in the photodiodes are removed from a depletion layer spreading from the second conductivity-type region of the charge sweep portion to the absorption layer. The image pickup device having such a structure can prevent the occurrence of the state where images cannot be formed, which results from the entry of highly bright light, and can sweep out the carriers accumulated in the photodiodes in a short time to produce smooth motion pictures.

According to another aspect of the invention, an image pickup device is provided which includes the above-described photodiode array having the functional portion acting as the monitor light-receiving portion, and a driving circuit driving the photodiode array. In this image pickup device, the driving circuit transmits a control signal to the photodiodes of the photodiode array based on a signal of light reception level from the monitor light-receiving portion so as to control the gain or on-off state of the photodiodes. The image pickup device having such a structure can prevent the occurrence of the state where images cannot be formed, which results from the entry of highly bright light. This structure is particularly suitable for the case not requiring motion pictures.

According to another aspect of the invention, an image pickup device is provided which includes the above-described photodiode array having the functional portion acting as the charge sweep portion, and a driving circuit driving the photodiode array. In this image pickup device, the driving circuit applies a pulsed reverse bias voltage to the charge sweep portion in synchronization with the driving timing of the photodiodes with a specific relationship so that charges accumulated in the photodiodes are removed by a depletion layer spreading from the second conductivity-type region of the charge sweep portion to the absorption layer.

Thus, the depletion layer of the charge sweep portion can be spread by applying a reverse bias voltage from the driving circuit to the charge sweep portion in synchronization with the timing of image formation, and carriers accumulated in the pn junctions of the photodiodes can be removed from the depletion layer. Consequently, the time required for removing the carriers can be reduced by use of the driving circuit. Accordingly, images of a motion picture can be rapidly renewed to produce smooth motion pictures. This structure is particularly suitable for the case in which motion pictures are used with incident light level not varying.

The image pickup device of the invention can be applied to various types of device including cameras and sensors, as long as light reception signals from a plurality of photodiodes are analyzed for respective portions.

The photodiode array and the image pick up device of the invention can prevent the occurrence of the state where images cannot be formed which results from the continuation of a state in which carriers are saturated by entry of highly bright light, and/or can sweep out the carriers accumulated in the photodiodes in a short time to produce smooth motion pictures.

DESCRIPTION OF THE PREFERRED EMBODIMENTS

First Embodiment

Figure 1:
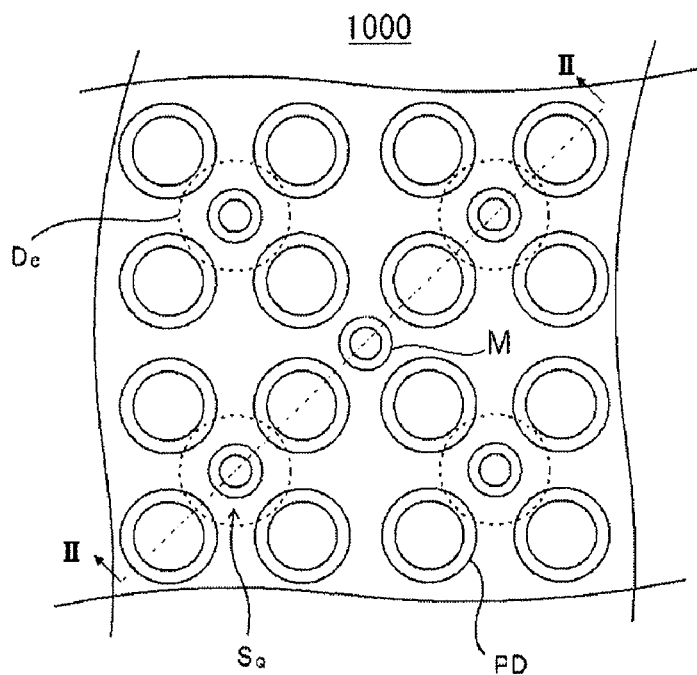
FIG. 1 is a plan view of a photodiode array according to a first embodiment of the invention.
Figure 2:
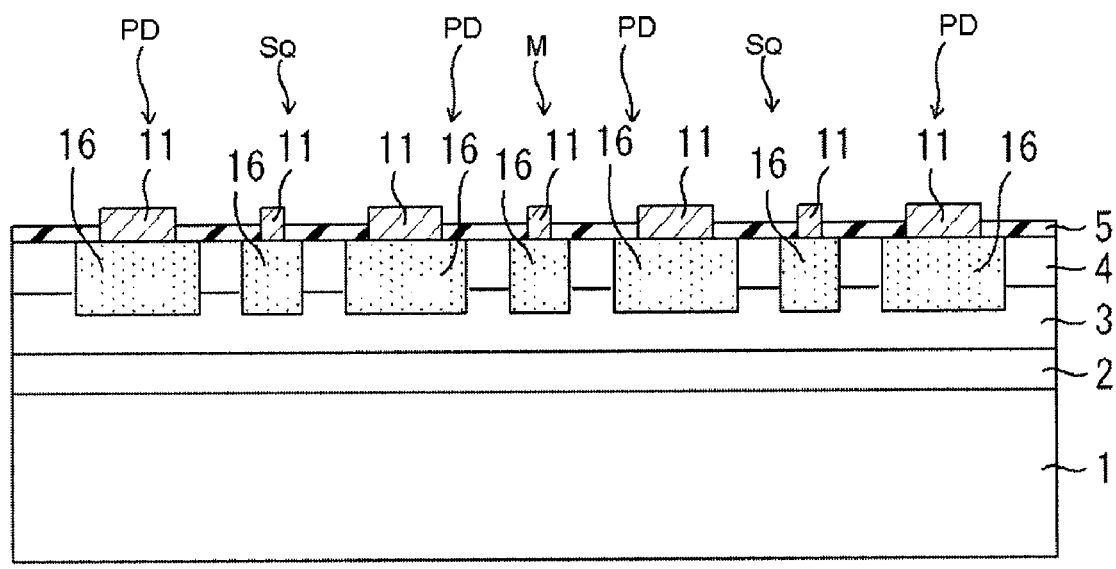
FIG. 2 is a sectional view of the photodiode array shown in FIG. 1.

FIG. 1 is a plan view of a photodiode array 1000 according to a first embodiment of the invention. The photodiode array 1000, in plan view, includes periodically arranged photodiodes PD acting as light-receiving elements, monitor light-receiving portions M disposed among the photodiodes PD, and charge sweep portions SQ arranged among the photodiodes PD in a proportion of one to every four photodiodes PD. The number of monitor light-receiving portions M is independent of the number of photodiodes PD, and may be one for the entirety of the photodiode array. Alternatively, a plurality of monitor light-receiving portions M may be disposed at, for example, the center and four corners of the photodiode array, or other positions suitable to monitor input signals. In other words, any arrangement may be employed as long as incident light can be monitored so as to prevent the continuation of a state where images cannot be formed in a full charge state brought by the entry of highly bright light. Each charge sweep portion SQ, in plan view, is surrounded by four photodiodes PD, and is positioned at the center of the area defined by the four photodiodes PD. FIG. 2 is a sectional view of the photodiode array taken along line II-II in FIG. 1. As shown in FIG. 2, the photodiode array 1000 includes a single semiconductor laminate (constituted of InP substrate 1, n-type (first conductivity-type) InP buffer layer 2, GaIn-NAs absorption layer 3, and InP window layer 4). The GaIn-NAs absorption layer 3 has a light-receiving sensitively in the near infrared region, and may contain Sb and/or P. Sb is added to enhance the crystallinity of the absorption layer. If high light-receiving sensitivity is not required in the near infrared region, the absorption layer may not contain N, forming a GaInAs layer. The window layer 4 may be formed of InP or any other material capable of lattice-matching with the absorption layer 3 and having a larger band gap than the absorption layer 3. Other structures are also possible, for example: a structure in which the absorption layer has type 2 multiquantum wells consisting of InGaAs/GaAsSb or GaIn-NAs/GaAsSb, and a diffusive-concentration-distribution-adjusting layer made of InGaAs is disposed between this absorption layer and the window layer.

In FIG. 2, an impurity diffusion mask pattern 5 is formed of SiN on the InP window layer 4 so as to have openings corresponding to the photodiodes PD, the monitor light-receiving portions M, and the charge sweep portions SQ. Zn is introduced and diffused from the openings of the mask pattern 5 to form p-type (second conductivity-type) regions 16 in the photodiodes PD, the monitor light-receiving portions M, and the charge sweep portions SQ.

Although the monitor light-receiving portion M has a smaller area than the photodiode PD in the embodiment shown in FIGS. 1 and 2, the area of the monitor light-receiving portion M may be the same as or larger than that of the photodiode PD because they can be controlled by a control circuit. The monitor light-receiving portion M having a smaller area than the photodiode PD is advantageous because of the following reasons: (1) when high-intensity light enters, the monitor light-receiving portion M tends to be saturated earlier than the photodiode PD, and can prevent halation only by a wired logic circuit (hardware) without calculating the intensity of input light for microcomputer control of the photodiode PD; and (2) the monitor light-receiving portions M can be easily disposed among the periodically arranged photodiodes PD.

Although the charge sweep portion SQ has a smaller area than the photodiode PD in the embodiment shown in FIGS. 1 and 2, the area of the charge sweep portion SQ may be the same as or larger than that of the photodiode PD because the spread of the depletion layer can be controlled by a reverse bias voltage. The charge sweep portion SQ having a smaller area than the photodiode PD is advantageous because the charge sweep portions SQ can be easily disposed among the periodically arranged photodiodes PD in a larger periodic arrangement than the photodiode PD.

Figure 3:
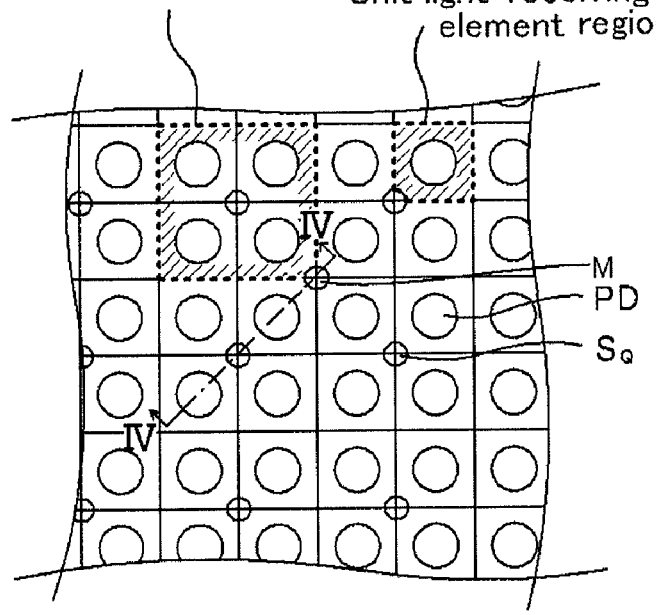
FIG. 3 is a plan view of an image pickup device including a photodiode array and a multiplexer.

FIG. 3 is a plan view of an image pickup device 5000 including the photodiode array and a multiplexer, showing the photodiodes PD, the monitor light-receiving portions M, and the charge sweep portions SQ in solid lines. As shown in FIG. 3, the number of monitor light-receiving portions M is independent of the number of photodiodes S, and may be one for the entirety of the photodiode array. Alternatively, a plurality of monitor light-receiving portions M may be disposed at, for example, the center and four corners of the photodiode array, or other positions suitable to monitor input signals. In other words, any arrangement may be employed as long as incident light can be monitored so as to prevent the continuation of a state where images cannot be formed in a full charge state brought by the entry of highly bright light. As shown in FIG. 3, the charge sweep portions SQ are arranged in a proportion of one to every four photodiodes PD, and each is disposed at the center of an area defined by four photodiodes. This is because this arrangement allows a depletion layer De spreading from the charge sweep portion SQ to be present with the same distance from the four surrounding pn junctions or depletion layers formed in the pn junctions and thus to come in contact with the four in the same manner, as shown in FIG. 1. FIG. 3 shows a unit photodiode region where a single photodiode PD is present and a region for which a single charge sweep portion SQ functions.

Figure 4:
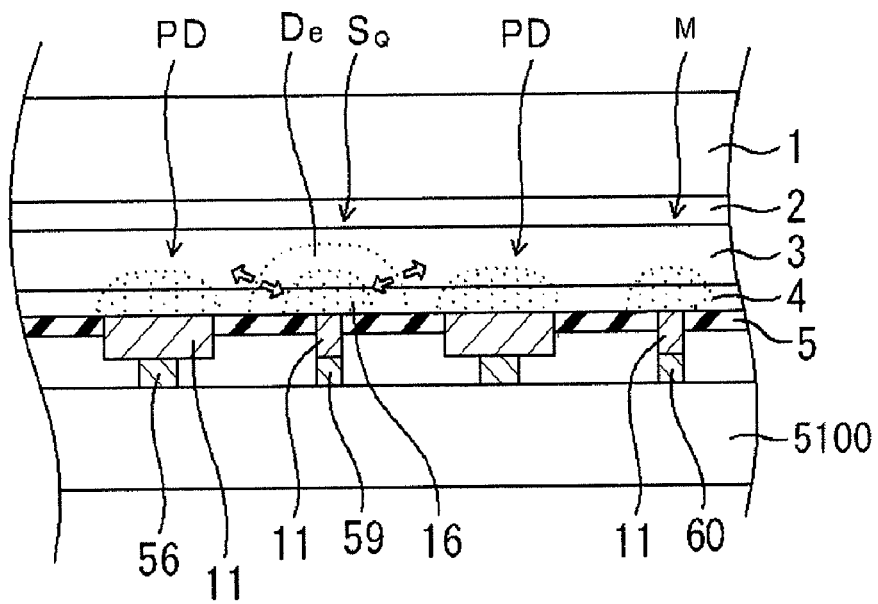
FIG. 4 is a sectional view of the image pickup device taken along line IV-IV in FIG. 3.

FIG. 4 is a sectional view of the image pickup device taken along line IV-IV in FIG. 3. Each photodiode PD has a p electrode 11 and an n electrode (not shown). The p electrode 11 is electrically connected to the corresponding input terminal 56 of the multiplexer 5100 with, for example, a solder bump (not shown). The n electrode, to which a common ground potential is applied, is electrically connected to a ground terminal (not shown) of the multiplexer 5100 in the same manner. Preferably, the multiplexer 5100 is of a CMOS type.

The monitor light-receiving portion M also has a p electrode 11. The p electrode 11 is electrically connected to the corresponding monitor terminal 60 of the multiplexer 5100 with, for example, solder bump (not shown). The multiplexer 5100 includes a signal processing circuit (control circuit) that controls the light-receiving operation of each photodiode PD based on the light reception signal from the monitor light-receiving portion M through the p electrode 11. The light-receiving operation of the photodiode PD may be controlled by on-off control to interrupt the light reception signal from the photodiode PD to the multiplexer 5100 or by gain control of the photodiode PD.

Figure 5:
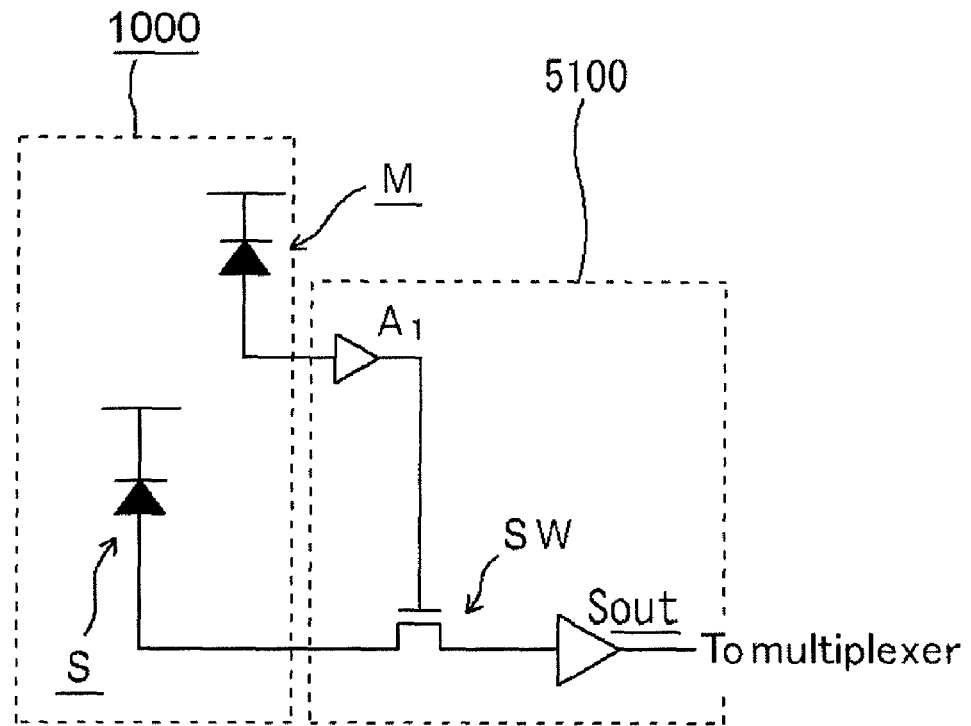
FIG. 5 is a circuit diagram of the image pickup device according to the first embodiment, wherein the circuit on-off controls the light reception signal output from a sensing portion based on the light reception signal of a monitor light-receiving portion.

FIG. 5 is a circuit diagram of on-off control to interrupt the light reception signal from the sensing portion S (photodiode) to the multiplexer 5100. When an object momentary turns highly bright, the signal processing circuit controls the switch or on-off state of the sensing portion S (photodiode) based on the output from the monitor light-receiving portion M. In order to quantify the degree of momentary increase in brightness, the output signal from the monitor light-receiving portion M may be processed into a gradient of the increase in brightness with time by an amplifying and differentiating circuit, as shown in FIG. 5. The gradient of the increase in brightness with time is turned into a spike state through the differentiating circuit. If the height of a spike is increased beyond a predetermined reference value, the output Sout to the multiplexer 5100 proper is interrupted.

Figure 6:
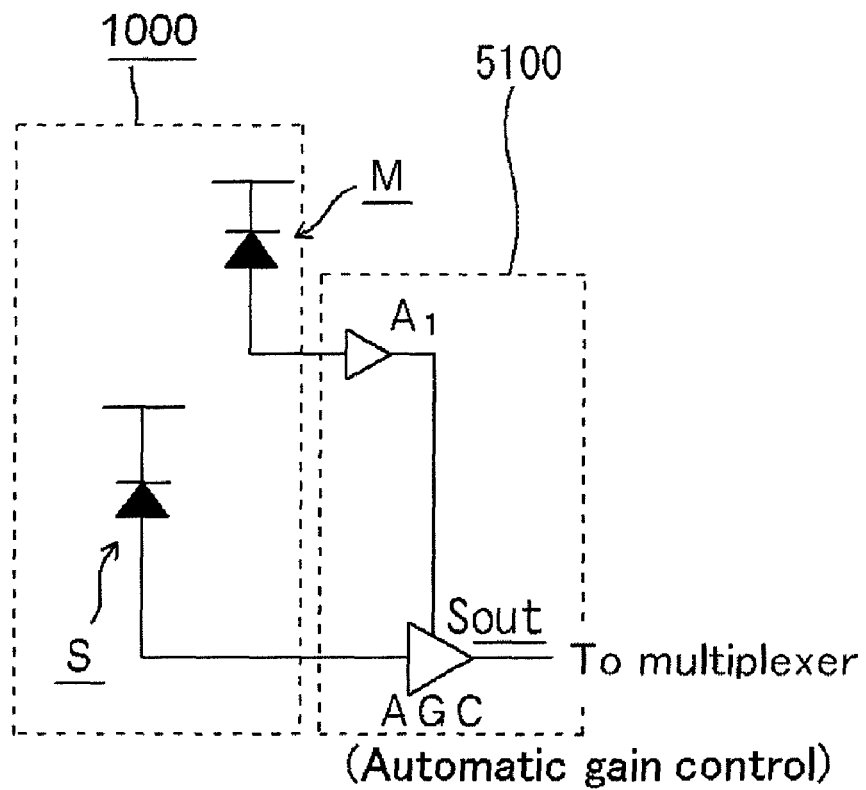
FIG. 6 is a circuit diagram of the image pickup device according to the first embodiment, wherein the circuit automatically gain-controls the light reception signal output from the sensing portion based on the light reception signal of a monitor light-receiving portion.

FIG. 6 is a circuit diagram for controlling the intensity of the light reception signal from the sensing portion S (photodiode) to the multiplexer 5100 according to the light reception signal of the monitor light-receiving portion M. In this instance, the amplifying and differentiating circuit processes the output from the monitor light-receiving portion M into a gradient of the increase in brightness with time, as in the case shown in FIG. 5. The gradient of the increase in brightness with time is turned into a spike state through the differentiating circuit. The output Sout to the multiplexer 5100 proper is gain-controlled (subjected to automatic gain control (AGC)) based on the spike height. Control circuits used in the multiplexer 5100 and other driving sections can employ conventional control methods.

Each charge sweep portion SQ also has a p electrode 11. The p electrode 11 is electrically connected to the corresponding charge sweep driving terminal 59 of the multiplexer 5100 with, for example, solder bump (not shown). The multiplexer 5100 includes a driving circuit that drives the photodiodes PD to form images. A reverse bias voltage is applied to the charge sweep portion SQ at a timing slightly later than the driving timing for forming images, so that the depletion layer De of the charge sweep portion spreads to come into contact with the depletion layers De of the pn junctions of the photodiodes PD. These contacts allow the charges accumulated in the photodiodes PD to be removed through the p electrode 11 of the charge sweep portion SQ. The photodiodes PD from which the charges have been removed can immediately receive another light.

The above-described operation is performed by repeating the following actions: (light reception)→(charge accumulation)→(charge sweep by charge sweep portion SQ)→(light reception)→ . . .

The time required for removing the charge accumulated by the action of "charge accumulation" has not been reduced effectively, and it takes a long time to operate the actions from the "charge accumulation" to the following "light reception". In the present embodiment, a reverse bias voltage is applied to the charge sweep portion SQ to spread the depletion layer. Thus, the charges of the photodiodes PD around the charge seep portion SQ can be rapidly removed. As a result, the period from light reception to the following light reception can be reduced to increase the frequency of image formation. Thus, a smooth motion picture is produced.

Although FIG. 4 does not show the depletion layers of the photodiodes PD, the photodiodes PD of course have depletion layers and their depletion layers accumulate charges. A depletion layer having a smaller thickness has a larger capacity and accumulates a larger amount of charge. A reverse bias voltage may be or may not be applied to the photodiodes PD. The pn junction naturally generates a depletion layer. The depletion layer of the photodiode PD spreads to the GaInNAs absorption layer side more than the p-type region side because GaInNAs absorption layer 3 is not doped, or is doped in a low concentration. The depletion layer De spread from the charge sweep portion SQ comes into contact with the depletion layers of the photodiodes PD and thus removes charges from the photodiodes PD.

Methods for manufacturing the photodiode array 1000 and the image pickup device 5000 will now be described. First, an n-type InP buffer layer 2 is formed on an n-type InP substrate 1. Preferably, the n-type InP substrate 1 and the n-type InP buffer layer 2 are doped with an n-type dopant Si to a high carrier concentration of $3 \times 10^{18}$ cm$^{-3}$. The n-type InP substrate 1 may be doped with Fe. The n-type InP buffer layer 2 can be formed by a known method, such as molecular beam epitaxy (MBE) growth or organometallic vapor phase epitaxy (OMVPE) growth. If a method performed at a high hydrogen concentration, such as OMVPE growth, is applied, heat treatment is desirably performed for dehydrogenation.

Then, a GaInNAs absorption layer 3 is grown on the n-type InP buffer layer 2. The absorption layer 3 may not be doped, or an n-type dopant Si may be added to a carrier concentration of about $3 \times 10^{15}$ cm$^{-3}$. MBE growth is preferably applied from the viewpoint of reducing hydrogen concentration. OMVPE growth may also be applied, but if the hydrogen concentration is high, dehydrogenation is performed. The GaInNAs absorption layer 3 may contain Sb to enhance the crystallinity. An InP window layer 4 is grown in contact with the GaInNAs absorption layer 3. The GaInNAs absorption layer 3 has a light-receiving sensitivity in the near infrared region at the long wavelength side, and may contain Sb and/or P. Sb is added to enhance the crystallinity of the absorption layer 3. If high light-receiving sensitivity is not required in the near infrared region, the absorption layer may not contain N, forming a GaInAs layer. The window layer 4 may be formed of InP or any other material capable of lattice-matching with the absorption layer 3 and having a larger band gap than the absorption layer 3. The above-described semiconductor laminate includes the following compound semiconductor layers: InP substrate 1, n-type InP buffer layer 2, GaInNAs absorption layer 3, and InP window layer 4.

In general, the InP buffer layer 2 has a thickness of about 1 to 2 μm, the GaInNAs absorption layer 3 has a thickness of about 2 to 3 μm, and the InP window layer 4 has a thickness of about 0.5 to 1.5 μm. A mask pattern 5 is formed of SiN on the InP window layer 4 so as to have openings in regions corresponding to the photodiodes PD, the monitor light-receiving portions M, and the charge sweep portions SQ, and a p-type dopant Zn is introduced from the openings through the InP window layer 4 to form p-type regions 16. The p-type regions 16 reach the GaInNAs absorption layer 3 so that their ends form pn junctions or pin junctions. Then, p electrodes 11 are formed of PtTi or the like on the p-type regions 16 of the InP window layer 4 with ohmic contact, and n electrodes (not shown) are also formed of AuGeNi or the like so as to connect to the periphery of the InP substrate 1 or the InP buffer layer 2 with ohmic contact.

The multiplexer 5100 may be formed in an overwhelmingly well-known silicon integrated circuit (IC). Even if the capacity of the multiplexer is limited, the above-described charge sweep mechanism copes with the problem. In order to apply a reverse bias voltage to the charge sweep portions SQ while driving the photodiodes PD, a driving circuit or the like using a conventional driving method or control method can be used.

In the photodiode array and the image pickup device including the photodiode array, the output of light reception signals of the photodiodes is controlled based on the monitoring of the monitor light-receiving portions. Thus, a state where images cannot be formed does not arise even if the brightness of an object is momentarily increased or highly bright light enters. Consequently, the photodiode array and the image pickup device can form clear images of objects. In addition, since charges accumulated in the photodiodes PD can be immediately removed, the photodiodes can immediately receive the following light. Consequently, the frequency of image formation can be increased and thus smooth motion pictures can be produced.

Second Embodiment

Figure 7:
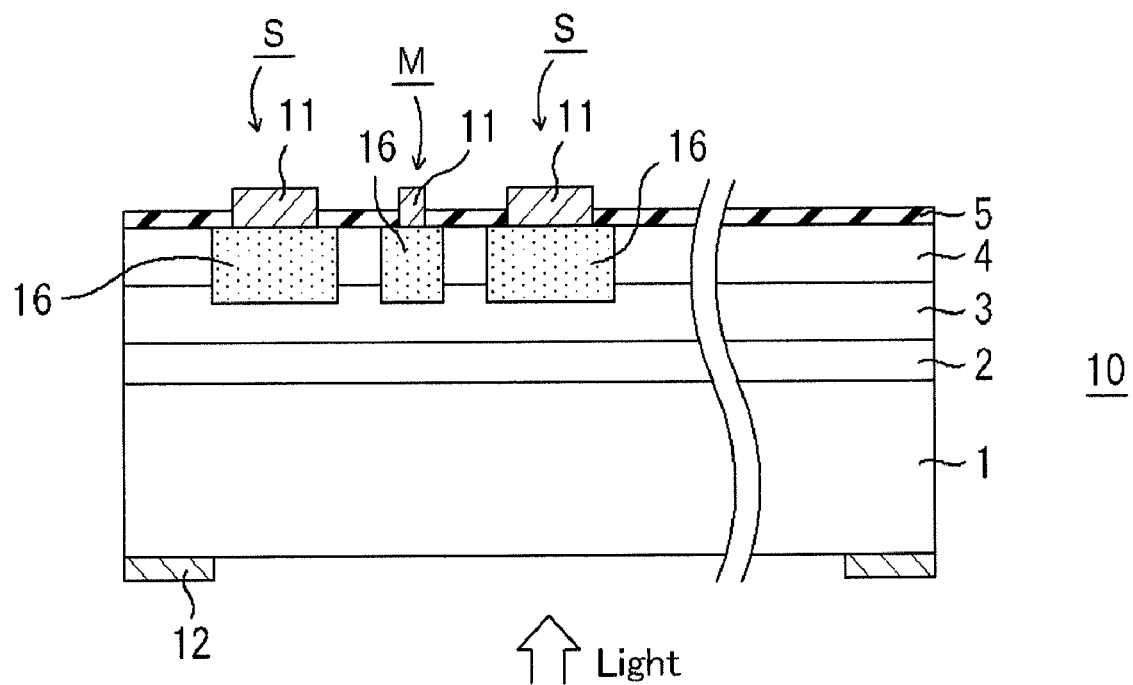
FIG. 7 is a sectional view of a photodiode array according to a second embodiment of the invention.
Figure 8:
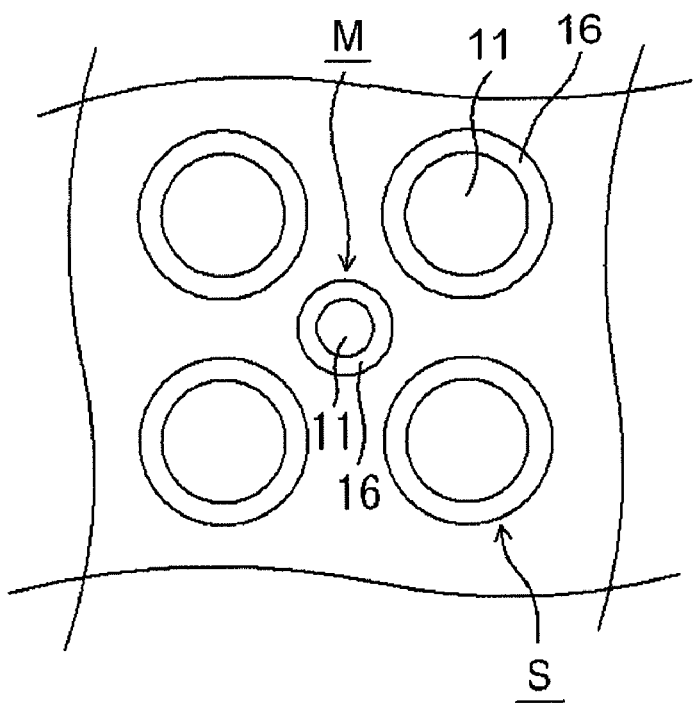
FIG. 8 is a plan view of the photodiode array shown in FIG. 7.

FIG. 7 is a fragmentary sectional view of an end portion of a photodiode array 10 according to a second embodiment of the invention. As shown in FIG. 7, the photodiode array 10 includes a single semiconductor laminate (constituted of an InP substrate 1, n-type (first conductivity-type) InP buffer layer 2, GaInNAs absorption layer 3, and InP window layer 4). FIG. 8 is a top view of the photodiode array 10. The photodiode array 10 includes periodically arranged sensing portions S acting as photodiodes and functional portions (monitor light-receiving portions M) disposed among the sensing portions S when viewed from above.

In FIG. 7, an impurity diffusion mask pattern 5 is formed of SiN over an InP window layer 4 so as to have openings corresponding to the sensing portions S and the monitor light-receiving portions M. Zn is introduced and diffused from the openings of the mask pattern 5 to form p-type (second conductivity-type) regions 16 in the sensing portions S and the monitor light-receiving portions M. Although the monitor light-receiving portion M has a smaller area than the sensing portion S in the embodiment shown in FIGS. 7 and 8, the area of the monitor light-receiving portion M may be the same as or larger than that of the sensing portion S because they can be controlled by a control circuit. The monitor light-receiving portion M having a smaller area than the sensing portion S is advantageous because of the following reasons:

(1) when high-intensity light enters, the monitor light-receiving portion M tends to be saturated earlier than the sensing portion S, and can prevent halation only by a wired logic circuit (hardware) without calculating the intensity of input light for microcomputer control of the sensing portion S; and (2) the monitor light-receiving portions M can be easily disposed among the periodically arranged sensing portions S.

Figure 9:
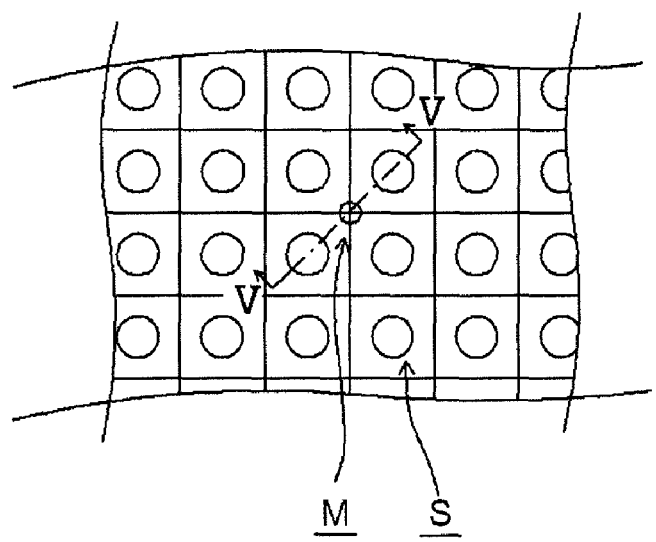
FIG. 9 is a plan view of an image pickup device including a photodiode array and a multiplexer.

FIG. 9 is a plan view of an image pickup device 50 including the photodiode array 10 and a multiplexer, showing the sensing portions S and the monitor light-receiving portions M in solid lines. As shown in FIG. 9, the number of monitor light-receiving portions M is independent of the number of sensing portions S, and may be one for the entirety of the photodiode array. Alternatively, a plurality of monitor light-receiving portions M may be disposed at, for example, the center and four corners of the photodiode array, or other positions suitable to monitor input signals. In other words, any arrangement may be employed as long as incident light can be monitored so as to prevent the continuation of a state where images cannot be formed in a full charge state brought by the entry of highly bright light.

Figure 10:
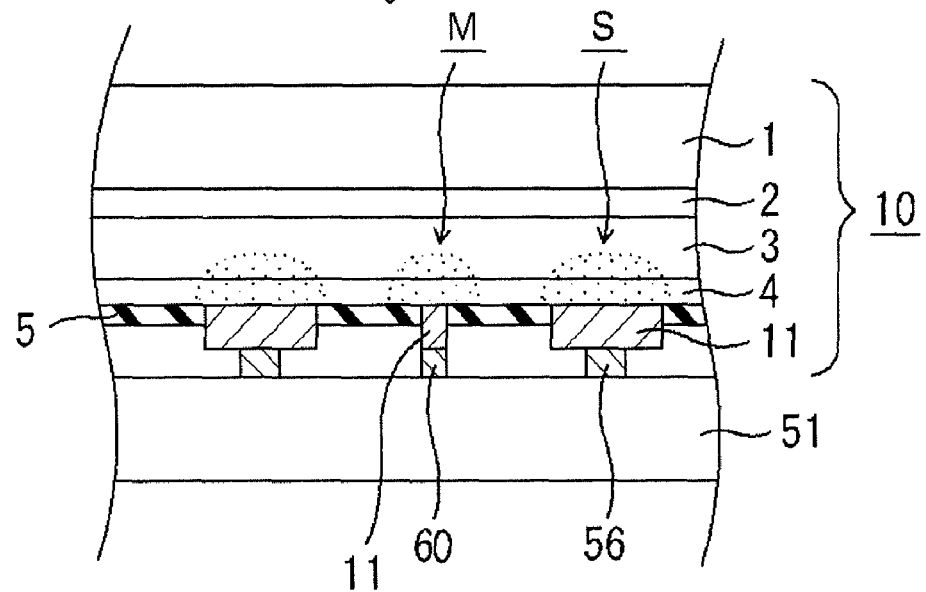
FIG. 10 is a sectional view of the image pickup device taken along line V-V in FIG. 9.

FIG. 10 is a sectional view of the image pickup device taken along line V-V in FIG. 9. Each sensing portion S has a p electrode 11 and an n electrode (not shown). The p electrode 11 is electrically connected to the corresponding input terminal 56 of the multiplexer 51 with, for example, a solder bump (not shown). The n electrode, to which a common ground potential is applied, is electrically connected to a ground terminal (not shown) of the multiplexer 51 in the same manner. Preferably, the multiplexer 51 is of a CMOS type.

The monitor light-receiving portion M also has a p electrode 11. The p electrode 11 is electrically connected to the corresponding monitor terminal 60 of the multiplexer 51 with, for example, solder bump (not shown). The multiplexer 51 includes a signal processing circuit (control circuit) that controls the light-receiving operation of each sensing portion S according to the light reception signal from the monitor light-receiving portion M through the p electrode 11. The light-receiving operation of the sensing portion S may be controlled by on-off control to interrupt the light reception signal from the sensing portion S to the multiplexer 51 or by gain control of the sensing portion S.

Figure 11:
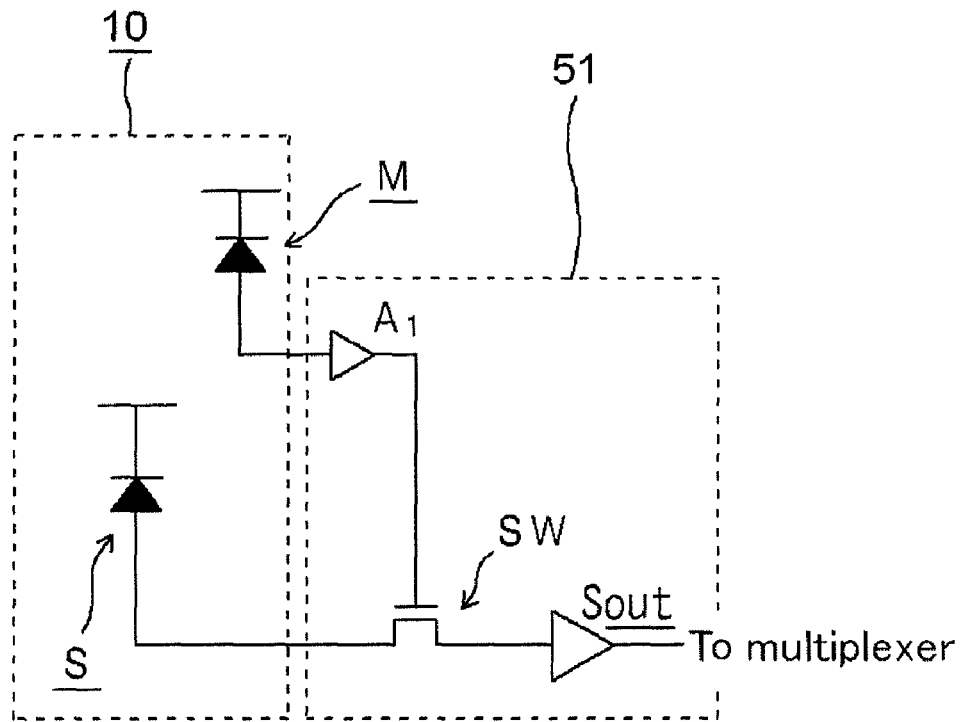
FIG. 11 is a circuit diagram of the image pickup device according to the second embodiment, wherein the circuit on-off controls the light reception signal output from a sensing portion based on the light reception signal of a monitor light-receiving portion.

FIG. 11 is a circuit diagram of on-off control to interrupt the light reception signal from the sensing portion S to the multiplexer 51. When an object momentary turns highly bright, the signal processing circuit controls the switch or on-off state of the sensing portion S based on the output from the monitor light-receiving portion M. In order to quantify the degree of momentary increase in brightness, the output signal from the monitor light-receiving portion M may be processed into a gradient of the increase in brightness with time by an amplifying and differentiating circuit, as shown in FIG. 11. The gradient of the increase in brightness with time is turned into a spike state through the differentiating circuit. If the height of a spike is increased beyond a predetermined reference value, the output Sout to the multiplexer 51 proper is interrupted.

Figure 12:
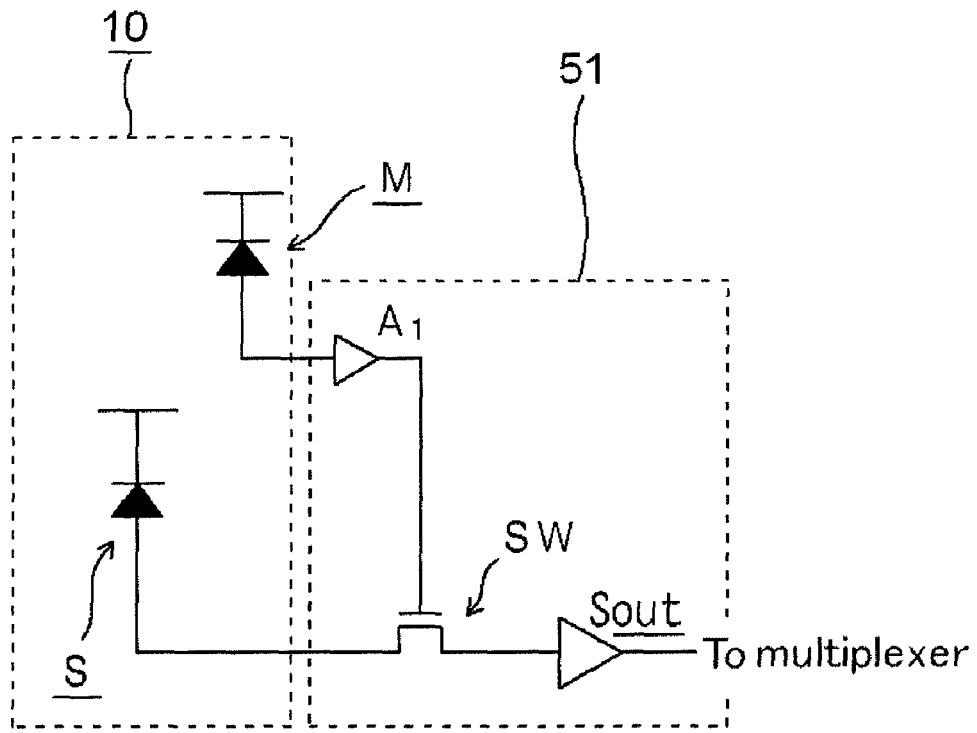
FIG. 12 is a circuit diagram of the image pickup device according to the second embodiment, wherein the circuit automatically gain-controls the light reception signal output from a sensing portion according to the light reception signal of a monitor light-receiving portion.

FIG. 12 is a circuit diagram for controlling the intensity of the light reception signal from the sensing portion S to the multiplexer 51 based on the light reception signal of the monitor light-receiving portion M. In this instance, the amplifying and differentiating circuit processes the output from the monitor light-receiving portion M into a gradient of the increase in brightness with time, as in the case shown in FIG. 11. The gradient of the increase in brightness with time is turned into a spike state through the differentiating circuit. The output Sout to the multiplexer 51 proper is gain-controlled (subjected to automatic gain control (AGC)) based on the spike height. Control circuits used in the multiplexer 51 and other driving sections can employ conventional control methods.

FIGS. 11 and 12 show a case in which a single monitor light-receiving portion M controls the output from a single sensing portion S. However, the single sensing portion S may be any one of the photodiodes of the photodiode array, and thus the outputs from all sensing portions S may be controlled by a single monitor light-receiving portion M. Alternatively, a single monitor light-receiving portion M may control some of the sensing portions S, in the region for which the monitor light-receiving portion M functions. In any case, the output from the sensing portion S is controlled by the monitor light-receiving portion M. Even if high-intensity light enters, this control can prevent the entry of highly bright light from causing a state where images cannot be formed.

Methods for manufacturing the photodiode array 10 and the image pickup device 50 will now be described. First, an n-type InP buffer layer 2 is formed on an n-type InP substrate 1. Preferably, the n-type InP substrate 1 and the n-type InP buffer layer 2 are doped with an n-type dopant Si to a high carrier concentration of $3 \times 10^{18}$ cm$^{-3}$. The n-type InP substrate 1 may be doped with Fe. The n-type InP buffer layer 2 can be formed by a known method, such as molecular beam epitaxy (MBE) growth or organometallic vapor phase epitaxy (OMVPE) growth. If a method performed at a high hydrogen concentration, such as OMVPE growth, is applied, heat treatment is desirably performed for dehydrogenation.

Then, a GaInNAs absorption layer 3 is grown on the n-type InP buffer layer 2. The absorption layer 3 may not be doped, or an n-type dopant Si may be added to a carrier concentration of about $3 \times 10^{15}$ cm$^{-3}$. MBE growth is preferably applied from the viewpoint of reducing hydrogen concentration. OMVPE growth may also be applied, but if the hydrogen concentration is high, dehydrogenation is performed. The GaInNAs absorption layer 3 may contain Sb to enhance the crystallinity. An InP window layer 4 is grown in contact with the GaInNAs absorption layer 3. The GaInNAs absorption layer 3 has a light-receiving sensitivity in the near infrared region at the long wavelength side, and may contain Sb and/or P. Sb is added to enhance the crystallinity of the absorption layer 3. If high light-receiving sensitivity is not required in the near infrared region, the absorption layer may not contain N, forming a GaInAs layer. The window layer 4 may be formed of InP or any other material capable of lattice-matching with the absorption layer 3 and having a larger band gap than the absorption layer 3. The above-described semiconductor laminate includes the following compound semiconductor layers: InP substrate 1, n-type InP buffer layer 2, GaInNAs absorption layer 3, and InP window layer 4.

In general, the InP buffer layer 2 has a thickness of about 1 to 2 µm, the GaInNAs absorption layer 3 has a thickness of about 2 to 3 µm, and the InP window layer 4 has a thickness of about 0.5 to 1.5 µm. A mask pattern 5 is formed of SiN on the InP window layer 4 so as to have openings in regions corresponding to the sensing portions S and the monitor light-receiving portions M, and a p-type dopant Zn is introduced from the openings through the InP window layer 4 to form p-type regions 16. The p-type regions 16 reach the GaInNAs absorption layer 3 so that their ends form pn junctions or pin junctions. Then, p electrodes 11 are formed of PtTi or the like on the p-type regions 16 of the InP window layer 4 with ohmic contact, and n electrodes 12 are also formed of AuGeNi or the like so as to connect to the periphery of the InP substrate 1 or the InP buffer layer 2 with ohmic contact.

In the photodiode array and the image pickup device including the photodiode array, the output of light reception signals of the photodiodes is controlled based on the monitoring of the monitor light-receiving portions. Thus, a state where images cannot be formed does not arise even if the brightness of an object is momentarily increased or highly bright light enters. Consequently, the photodiode array and the image pickup device can form clear images of objects.

Third Embodiment

Figure 13:
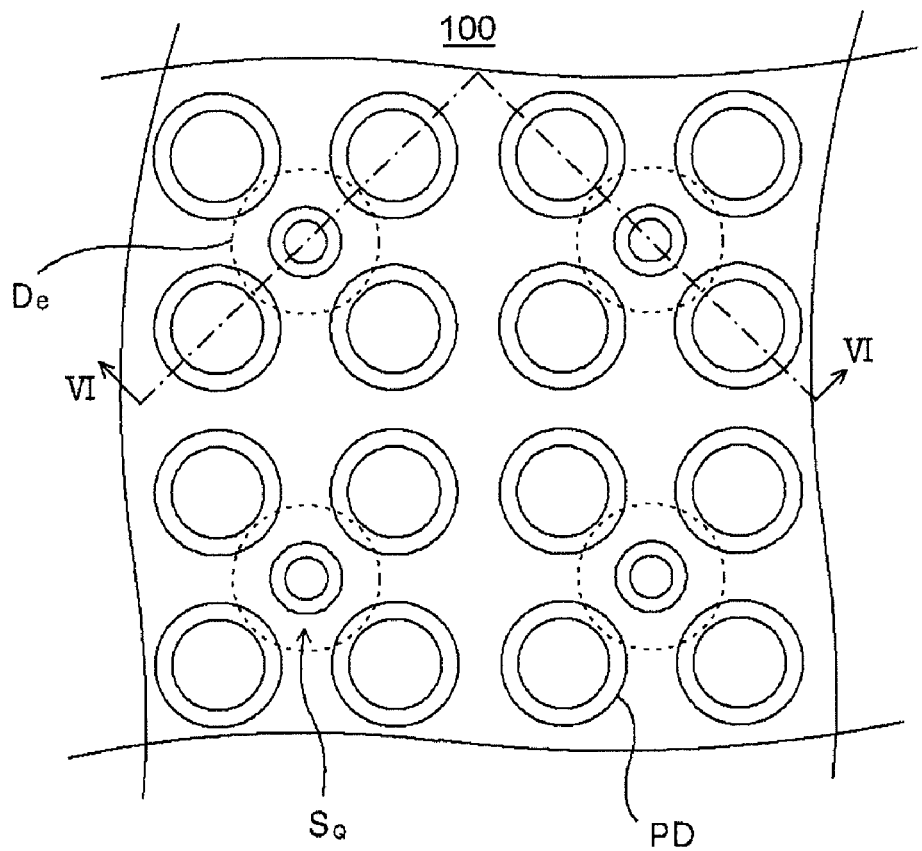
FIG. 13 is a plan view of a photodiode array according to a third embodiment of the invention.
Figure 14:
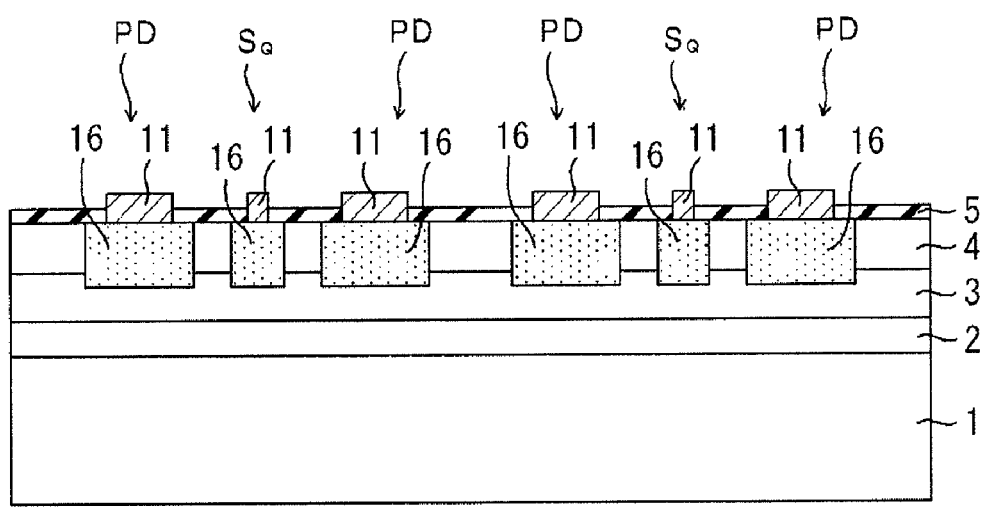
FIG. 14 is a fragmentary sectional view of the photodiode array according to the third embodiment of the invention.

FIG. 13 is a top view of a photodiode array 100 according to a third embodiment of the invention. The photodiode array 100, in plan view, includes a periodically arranged photodiodes PD acting as light-receiving elements, and functional portions (charge sweep portions SQ) arranged among the photodiodes in a proportion of one to every four photodiodes PD. Each charge sweep portion SQ, in plan view, is surrounded by four photodiodes PD, and is positioned at the center of the area defined by the four photodiodes PD. FIG. 14 is a sectional view of the photodiode array taken along line VI-VI in FIG. 11. As shown in FIG. 13, the photodiode array 100 includes a single semiconductor laminate (constituted of an InP substrate 1, n-type (first conductivity-type) InP buffer layer 2, GaInNAs absorption layer 3, and InP window layer 4). The GaInNAs absorption layer 3 has a light-receiving sensitivity in the near infrared region at the long wavelength side, and may contain Sb and/or P. Sb is added to enhance the crystallinity of the absorption layer 3. If high light-receiving sensitivity is not required in the near infrared region, the absorption layer may not contain N, forming a GaInAs layer. The window layer 4 may be formed of InP or any other material capable of lattice-matching with the absorption layer 3 and having a larger band gap than the absorption layer 3.

In FIG. 14, an impurity diffusion mask pattern 5 is formed of SiN on the InP window layer 4 so as to have openings corresponding to the photodiodes PD and the charge sweep portions SQ. Zn is introduced and diffused from the openings of the mask pattern 5 to form p-type (second conductivity-type) regions 16 in the photodiodes PD and the charge sweep portions SQ.

Although the charge sweep portion SQ has a smaller area than the photodiode PD in the embodiment shown in FIGS. 13 and 14, the area of the charge sweep portion SQ may be the same as or larger than that of the photodiode PD because the spread of the depletion layer can be controlled by a reverse bias voltage. The charge sweep portion SQ having a smaller area than the photodiode PD is advantageous because the charge sweep portions SQ can be easily disposed among the periodically arranged photodiodes PD in a larger periodic arrangement than the photodiode PD.

Figure 15:
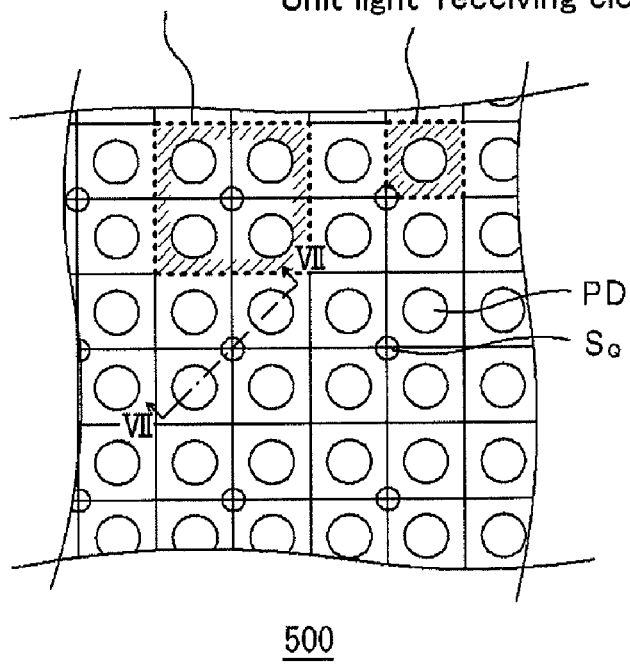
FIG. 15 is a plan view of an image pickup device according to the third embodiment of the invention.

FIG. 15 is a plan view of an image pickup device 500 including the photodiode array and a multiplexer, showing the photodiodes PD and the charge sweep portions SQ in solid lines. As shown in FIG. 15, the charge sweep portions SQ are arranged among the photodiodes PD in a proportion of one to every four photodiodes PD, and each is disposed at the center of an area defined by four photodiodes. This is because this arrangement allows a depletion layer De spreading from the charge sweep portion SQ to be present with the same distance from the four surrounding pn junctions or depletion layers formed in the pn junctions and thus to come in contact with the four in the same manner, as shown in FIG. 13. FIG. 15 shows a unit photodiode region where a single photodiode PD is present and a region for which a single charge sweep portion SQ functions.

Figure 16:
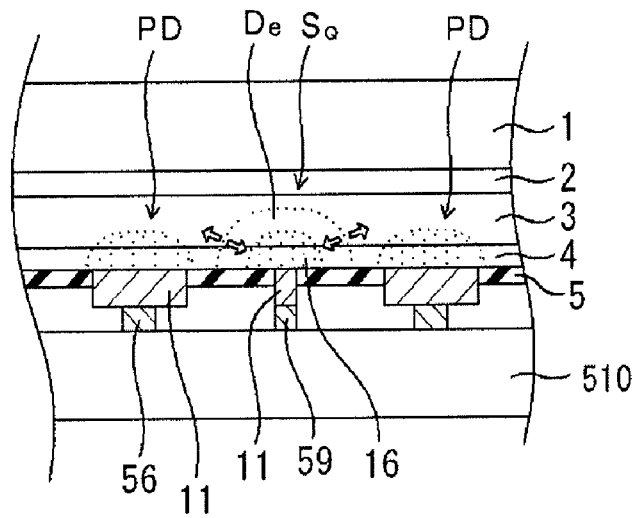
FIG. 16 is a sectional view of the image pickup device taken along line VII-VII in FIG. 15.

FIG. 16 is a sectional view of the image pickup device taken along line VII-VII in FIG. 15. Each photodiode PD has a p electrode 11 and an n electrode (not shown). The p electrode 11 is electrically connected to the corresponding input terminal 56 of the multiplexer 510 with, for example, a solder bump (not shown). The n electrode, to which a common ground potential is applied, is electrically connected to a ground terminal (not shown) of the multiplexer 510 in the same manner. Preferably, the multiplexer 510 is of a CMOS type.

Each charge sweep portion SQ also has a p electrode 11. The p electrode 11 is electrically connected to the corresponding charge sweep driving terminal 59 of the multiplexer 510 with, for example, solder bump (not shown). The multiplexer 510 includes a driving circuit that drives the photodiodes PD to form images. A reverse bias voltage is applied to the charge sweep portion SQ at a timing slightly later than the driving timing for forming images, so that the depletion layer De of the charge sweep portion spreads to come into contact with the depletion layers De of the pn junctions of the photodiodes PD. These contacts allow the charges accumulated in the photodiodes PD to be removed through the p electrode 11 of the charge sweep portion SQ. The photodiodes PD from which the charges have been removed can immediately receive another light.

The above-described operation is performed by repeating the following actions: (light reception)→(charge accumulation)÷(charge sweep by charge sweep portion SQ)→(light reception)→ . . .
The time required for removing the charge accumulated by the action of "charge accumulation" has not been reduced effectively, and it takes a long time to operate the actions from the "charge accumulation" to the following "light reception". In the present embodiment, a reverse bias voltage is applied to the charge sweep portion SQ to spread the depletion layer. Thus, the charges of the photodiodes PD around the charge seep portion SQ can be rapidly removed. As a result, the period from light reception to the following light reception can be reduced to increase the frequency of image formation per unit time. Thus, a smooth motion picture is produced.

Although FIG. 16 does not show the depletion layers of the photodiodes PD, the photodiodes PD of course have depletion layers and their depletion layers accumulate charges. A depletion layer having a smaller thickness has a larger capacity and accumulates a larger amount of charge. A reverse bias voltage may be or may not be applied to the photodiodes PD. The pn junction naturally generates a depletion layer. The depletion layer of the photodiode PD spreads to the GaInNAs absorption layer side more than the p-type region side because GaInNAs absorption layer 3 is not doped, or is doped in a low concentration. The depletion layer De spread from the charge sweep portion SQ comes into contact with the depletion layers of the photodiodes PD and thus removes charges from the photodiodes PD.

Methods for manufacturing the photodiode array 100 and the image pickup device 500 will now be described. First, an n-type InP buffer layer 2 is formed on an n-type InP substrate 1. Preferably, the n-type InP substrate 1 and the n-type InP buffer layer 2 are doped with an n-type dopant Si to a high carrier concentration of $3\times10^{18}$ cm$^{-3}$. The n-type InP substrate 1 may be doped with Fe. The n-type InP buffer layer 2 can be formed by a known method, such as molecular beam epitaxy (MBE) growth or organometallic vapor phase epitaxy (OMVPE) growth. If a method performed at a high hydrogen concentration, such as OMVPE growth, is applied, heat treatment is desirably performed for dehydrogenation.

Then, a GaInNAs absorption layer 3 is grown on the n-type InP buffer layer 2. The absorption layer 3 may not be doped, or an n-type dopant Si may be added to a carrier concentration of about $3\times10^{15}$ cm$^{-3}$. MBE growth is preferably applied from the viewpoint of reducing hydrogen concentration. OMVPE growth may also be applied, but if the hydrogen concentration is high, dehydrogenation is performed. The GaInNAs absorption layer 3 may contain Sb to enhance the crystallinity. An InP window layer 4 is grown in contact with the GaInNAs absorption layer 3. The GaInNAs absorption layer 3 has a light-receiving sensitivity in the near infrared region at the long wavelength side, and may contain Sb and/or P. Sb is added to enhance the crystallinity of the absorption layer 3. If high light-receiving sensitivity is not required in the near infrared region, the absorption layer may not contain N, forming a GaInAs layer. The window layer 4 may be formed of InP or any other material capable of lattice-matching with the absorption layer 3 and having a larger band gap than the absorption layer 3. The above-described semiconductor laminate includes the following compound semiconductor layers: InP substrate 1, n-type InP buffer layer 2, GaInNAs absorption layer 3, and InP window layer 4.

In general, the InP buffer layer 2 has a thickness of about 1 to 2μm, the GaInNAs absorption layer 3 has a thickness of about 2 to 3 μm, and the InP window layer 4 has a thickness of about 0.5 to 1.5 μm. A mask pattern 5 is formed of SiN on the InP window layer 4 so as to have openings in regions corresponding to the photodiodes PD and the monitor light-receiving portions M, and a p-type dopant Zn is introduced from the openings through the InP window layer 4 to form p-type regions 16. The p-type regions 16 reach the GaInNAs absorption layer 3 so that their ends form pn junctions or pin junctions. Then, p electrodes 11 are formed of PtTi or the like on the p-type regions 16 of the InP window layer 4 with ohmic contact, and n electrodes (not shown) are also formed of AuGeNi or the like so as to connect to the periphery of the InP substrate 1 or the InP buffer layer 2 with ohmic contact.

The multiplexer 510 may be formed in an overwhelmingly well-known silicon integrated circuit (IC). Even if the capacity of the multiplexer is limited, the above-described charge sweep mechanism copes with the problem. In order to apply a reverse bias voltage to the charge sweep portions SQ while driving the photodiodes PD, a driving circuit or the like using a conventional driving method or control method can be used.

In the photodiode array and the image pickup device including the photodiode array, charges accumulated in the photodiodes PD can be immediately removed, and thus the photodiodes can immediately receive following light. Consequently, the frequency of image formation can be increased and thus smooth motion pictures can be produced.

While the present invention has been described with reference to exemplary embodiments, it is to be understood that the invention is not limited to the disclosed exemplary embodiments. The scope of the invention is set forth in the attached claims and encompasses all modifications and equivalent structures and functions within the scope of the invention.

What is claimed is:

1. A photodiode array comprising:
a plurality of photodiodes arranged in a single semiconductor laminate including a first conductivity-type semiconductor layer and an absorption layer on the first conductivity-type semiconductor layer, and a plurality of functional portions,
wherein the functional portions are disposed among the photodiodes, the functional portions include a monitor light-receiving portion and a charge sweep portion,
each of the photodiodes having a second conductivity-type region reaching the absorption layer from the top surface of the semiconductor laminate and an electrode in ohmic contact with the second conductivity-type region of respective photodiodes, and
each of the functional portions having a second conductivity-type region reaching the absorption layer from the top surface of the semiconductor laminate and an electrode in ohmic contact with the second conductivity-type region of respective functional portions.

2. The photodiode array according to claim 1, wherein the second conductivity-type region of the monitor light-receiving portion has a smaller area than the second conductivity-type region of the photodiode when viewed from above.

3. The photodiode array according to claim 1, wherein the charge sweep portion is arranged in a proportion of one to every four photodiodes, and is disposed at the center of an area defined by the four photodiodes when viewed from above.

4. The photodiode array according to claim 1, wherein each layer of the semiconductor laminate is made of a Group III-V compound semiconductor and the dopant of the second conductivity-type region is Zn.

5. The photodiode array according to claim 1, wherein the photodiodes are pin photodiodes.

6. An image pickup device comprising the photodiode array as set forth in claim 1; and a driving circuit driving the photodiode array, wherein the driving circuit transmitting a control signal to the photodiodes of the photodiode array based on a signal of light reception level from the monitor light-receiving portion to control the gain or on-off state of the photodiodes, and applying a pulsed reverse bias voltage to the charge sweep portion in synchronization with the driving timing of the photodiodes with a specific relationship so that charges accumulated in the photodiodes are removed by a depletion layer spreading from the second conductivity-type region of the charge sweep portion to the absorption layer.

7. A photodiode array comprising:
a plurality of photodiodes arranged in a single semiconductor laminate including a first conductivity-type semiconductor layer and an absorption layer on the first conductivity-type semiconductor layer, and a plurality of functional portions,
wherein the functional portion is a monitor light-receiving portion, disposed among the photodiodes,
each of the photodiodes having a second conductivity-type region reaching the absorption layer from the top surface of the semiconductor laminate and an electrode in ohmic contact with the second conductivity-type region of respective photodiodes, and
each of the functional portions having a second conductivity-type region reaching the absorption layer from the top surface of the semiconductor laminate and an electrode in ohmic contact with the second conductivity-type region of respective functional portions.

8. The photodiode array according to claim 7, wherein the second conductivity-type region of the monitor light-receiving portion has a smaller area than the second conductivity-type region of the photodiode when viewed from above.

9. The photodiode array according to claim 7, wherein each layer of the semiconductor laminate is made of a Group III-V compound semiconductor and the dopant of the second conductivity-type region is Zn.

10. The photodiode array according to claim 7, wherein the photodiodes are pin-photodiodes.

11. An image pickup device comprising the photodiode array as set forth in claim 7; and a driving circuit driving the photodiode array, wherein the driving circuit is transmitting a control signal to the photodiodes of the photodiode array based on a signal of light reception level from the monitor light-receiving portion so as to control the gain or on-off state of the photodiodes.

12. A photodiode array comprising:
a plurality of photodiodes arranged in a single semiconductor laminate including a first conductivity-type semiconductor layer and an absorption layer on the first conductivity-type semiconductor layer, and a plurality of functional portions,
wherein the functional portion is a charge sweep portion, disposed among the photodiodes,
each of the photodiode having a second conductivity-type region reaching the absorption layer from the top surface of the semiconductor laminate and an electrode in ohmic contact with the second conductivity-type region of respective photodiodes, and
each of the functional portions having a second conductivity-type region reaching the absorption layer from the top surface of the semiconductor laminate and an electrode in ohmic contact with the second conductivity-type region of respective functional portions.

13. The photodiode array according to claim 12, wherein the charge sweep portion is arranged in a proportion of one to every four photodiodes, and is disposed at the center of an area defined by the four photodiodes when viewed from above.

14. The photodiode array according to claim 12, wherein each layer of the semiconductor laminate is made of a Group III-V compound semiconductor and the dopant of the second conductivity-type region is Zn.

15. The photodiode array according to claim 12, wherein the photodiodes are pin-photodiodes.

16. An image pickup device comprising the photodiode array as set forth in claim 12; and a driving circuit driving the photodiode array, wherein the driving circuit is applying a pulsed reverse bias voltage to the charge sweep portion in synchronization with the driving timing of the photodiodes with a specific relationship so that charges accumulated in the photodiodes are removed from a depletion layer spreading from the second conductivity-type region of the charge sweep portion to the absorption layer.

* * * * *